United States Patent
Fischer et al.

(10) Patent No.: US 8,440,020 B2
(45) Date of Patent: May 14, 2013

(54) APPARATUS AND METHOD FOR THE PRODUCTION OF FLEXIBLE SEMICONDUCTOR DEVICES

(75) Inventors: Diego Fischer, Neuchatel (CH); Pedro Torres, Neuchatel (CH)

(73) Assignee: VHF Technologies SA, Le Locle (CH)

( * ) Notice: Subject to any disclaimer, the term of this patent is extended or adjusted under 35 U.S.C. 154(b) by 1440 days.

(21) Appl. No.: 10/370,935

(22) Filed: Feb. 20, 2003

(65) Prior Publication Data
US 2003/0172873 A1    Sep. 18, 2003

(30) Foreign Application Priority Data
Mar. 15, 2002    (EP) .................................. 02076056

(51) Int. Cl.
*C23C 16/00* (2006.01)
*H01L 21/306* (2006.01)

(52) U.S. Cl.
USPC ........... 118/718; 118/669; 118/672; 118/679; 118/697; 118/723 E (58) Field of Classification Search ................ 118/718, 118/697; 204/298.24
See application file for complete search history.

(56) References Cited

U.S. PATENT DOCUMENTS

| | | | | |
|---|---|---|---|---|
| 3,884,787 | A * | 5/1975 | Kuehnle .................... | 204/192.12 |
| 4,226,898 | A * | 10/1980 | Ovshinsky et al. ........... | 438/483 |
| 4,277,516 | A * | 7/1981 | Behn et al. ...................... | 427/81 |
| 4,400,409 | A * | 8/1983 | Izu et al. ....................... | 438/62 |
| 4,419,381 | A * | 12/1983 | Yamazaki ..................... | 427/576 |
| 4,438,723 | A | 3/1984 | Cannella et al. | |
| 4,479,369 | A * | 10/1984 | Sando et al. .................... | 68/5 C |
| 4,542,711 | A | 9/1985 | Izu et al. | |
| 4,902,398 | A * | 2/1990 | Homstad ................... | 204/298.24 |
| 4,968,918 | A * | 11/1990 | Kondo et al. ............. | 315/111.21 |
| 4,981,566 | A * | 1/1991 | Wurczinger ............. | 204/192.13 |
| 5,338,389 | A * | 8/1994 | Nishizawa et al. ............. | 117/89 |
| 5,443,033 | A * | 8/1995 | Nishizawa et al. ............. | 117/86 |
| 5,474,648 | A * | 12/1995 | Patrick et al. .................... | 438/10 |
| 5,527,396 | A * | 6/1996 | Saitoh et al. ........... | 118/723 MP |
| 5,609,737 | A * | 3/1997 | Fukui et al. ............. | 204/192.12 |
| 5,652,029 | A | 7/1997 | Itoh | |
| 5,891,793 | A * | 4/1999 | Gardner et al. ............... | 438/585 |
| 5,916,365 | A * | 6/1999 | Sherman ........................ | 117/92 |
| 6,200,893 | B1 * | 3/2001 | Sneh ............................. | 438/685 |

(Continued)

FOREIGN PATENT DOCUMENTS

| | | |
|---|---|---|
| DE | 197 39 833 A1 | 3/1999 |
| JP | 58061273 A * | 4/1983 |
| JP | 2003201570 A * | 7/2003 |

*Primary Examiner* — Karla Moore
(74) *Attorney, Agent, or Firm* — Pearne & Gordon LLP (57) ABSTRACT

Apparatus for continuously producing flexible semiconductor devices through deposition of a plurality of semiconductor layers onto a moving flexible substrate by using Plasma Enhanced Chemical Vapor Deposition (PECVD) processing, where at least two successive layers are deposited in the same deposition chamber onto the substrate traveling in opposite directions. Computer program product directly loadable into the internal memory of a digital computer comprising software code portions for determining and controlling all the necessary parameters for the production of flexible semiconductor devices in a such apparatus when said computer program product is run on a computer. Roll-to-roll method for producing flexible semiconductor devices, wherein a plurality of semiconductor layers are deposited in the same deposition chamber onto a flexible substrate moving in opposite directions. Flexible semiconductor device produced with said method, where the penetration rate of one semiconductor layer into its neighboring layer is remarkably low.

24 Claims, 5 Drawing Sheets

U.S. PATENT DOCUMENTS

| | | | |
|---|---|---|---|
| 6,488,777 B2 * | 12/2002 | Madan et al. | 118/718 |
| 6,734,020 B2 * | 5/2004 | Lu et al. | 436/55 |
| 2002/0066411 A1 * | 6/2002 | Chiang et al. | 118/724 |
| 2002/0069826 A1 * | 6/2002 | Hunt et al. | 118/718 |

* cited by examiner

APPARATUS AND METHOD FOR THE PRODUCTION OF FLEXIBLE SEMICONDUCTOR DEVICES

This application claims priority of European Patent Application EP 02076056.7, the content of which is hereby incorporated.

FIELD OF THE INVENTION

The present invention relates to an apparatus for continuously producing flexible semiconductor devices through deposition of a plurality of semiconductor layers onto a moving flexible substrate by using Plasma Enhanced Chemical Vapor Deposition (PECVD) processing. The present invention also relates to a computer program product directly loadable into the internal memory of a digital computer comprising software code portions for controlling the production of flexible semi-conductor devices in an apparatus according to the invention when said computer program product is run on a computer. The present invention further relates to a roll-to-roll method for producing flexible semiconductor devices, wherein a plurality of semiconductor layers are deposited onto a moving flexible substrate, as well as to a flexible semiconductor device produced with said method.

RELATED ART

PECVD processing is currently used for the deposition of thin films of semiconductor materials onto a substrate. Plasma is generated by the ionization of an electrically neutral reactive gas submitted to a high electrical field. The gas is usually introduced in the electrical field near an electrode and the substrate placed within the reaction region for deposition is either grounded or placed near the electrical ground. The ions condense on the substrate, forming a layer of semiconductor material. The reactive gas can contain different dopants in order to generate N-type, intrinsic or P-type semiconductor layers. As an example, patent U.S. Pat. No. 4,892,753 describes the features and the functioning of a PECVD reactor.

The substrate onto which the semiconductor layers are deposited is generally either a solid wafer, mainly used for the production of semiconductor chips, or a flexible plastic-like foil, made for instance of polyimide or PET, mainly used for the production of large area semiconductor devices, such as panels of solar cells. The present invention relates to an apparatus adapted for semiconductor deposition on a flexible substrate. Flexible substrates allow the use of roll-to-roll deposition methods where the substrate is continuously unrolled from a feeding roll, driven through at least one deposition chamber and rolled onto a take-up roll after deposition. Such production methods are particularly adapted to mass-production.

Patent U.S. Pat. No. 4,542,711 describes a roll-to-roll semiconductor production apparatus. The flexible substrate is driven through at least three successive deposition chambers, each deposition chamber being dedicated to the deposition of one type of semiconductor material. For instance, in the preferred embodiment, the P-type layer is deposited in the first deposition chamber, the intrinsic layer is deposited in the second deposition chamber and the N-type layer is deposited in the third deposition chamber. Semiconductor devices can have a thickness ratio of 10 to 30:1 between the intrinsic and the doped layers. The main parameters determining the thickness of the deposited layer are the plasma temperature, the pressure, the reactive gas concentration and the time spent within the reaction region of the deposition chamber. In such production apparatuses, the pressure and temperature cannot significantly change from one deposition chamber to the next. The relative lengths of the reaction regions of the deposition chambers are therefore to a great extent determined by the thickness ratio between the semiconductor layers of the manufactured semiconductor device. If the variation of the thickness ratio cannot be compensated by a change in the relative reactive gas concentrations, the manufacture of other semiconductor devices having differing relative dimensions might require changing the relative chamber lengths, which can mean a relatively difficult and costly adaptation of the production apparatus. Another drawback of such production apparatuses is the complex isolation systems needed to prevent reaction gases from diffusing from one deposition chamber to the next, in order to avoid cross-contamination from one layer to the next, which would result, on the manufactured device, in a loss of interface steepness between two subsequent semiconductor layers, hence in lower device performance.

Patent EP-B1-608633 describes a semiconductor production apparatus using PECVD where all semiconductor layers are successively deposited onto a solid glass substrate in a unique deposition chamber, thus avoiding the isolation and flexibility issues. Differently doped reaction gases are introduced in the reaction region of the deposition chamber for different time periods. The thickness of each semiconductor layer can therefore be precisely determined, independently from the previous or the next layer. However, this method requires the deposition chamber to be purged between the deposition of two adjacent layers in order to avoid cross-contamination between them. A first disadvantage of this method is that, given the relatively small deposition surface, these purge cycles notably decrease the overall productivity of a given apparatus. A further disadvantage is that the surface of the last deposited semiconductor layer is not protected during the purge cycle, thus altering and possibly deteriorating the properties of its interface to the next layer.

In the context of thin film silicon solar cell manufacturing, the doping cross-contamination, particularly between a first doped and a subsequent intrinsic layer, is the most critical issue and requires therefore long and complex purge cycles or complex isolation systems depending on the configuration of the semiconductor production apparatus.

One of the aims of the present invention is to provide an easily adaptable apparatus for the roll-to-roll deposition of a plurality of semiconductor layers onto a flexible substrate.

Another aim is to avoid the deposition gas diffusion issues generally encountered in most of the current roll-to-roll PECVD production apparatuses, thus allowing the production of flexible semiconductor devices with significantly lower levels of cross-contamination between two subsequent semiconductor layers.

Another aim is to reduce the cost of the production apparatus.

Still another aim is to provide a fast production apparatus adapted to mass-production of flexible semiconductor devices.

BRIEF SUMMARY OF THE INVENTION

The aims mentioned above are achieved by an apparatus and a method including the features or steps of the corresponding independent claims, whereas preferred embodiments would include features or steps of the corresponding dependant claims.

The apparatus according to the present invention is easily adaptable as it allows independent tuning of all production parameters, in particular substrate speed through the reaction region, from one deposition phase to the next. Furthermore, with the use of the production is method according to the present invention, different type of devices, i.e. p-i-n, n-i-p, double and triple stacked cells as well as thin film transistors (TFT) can be produced on the same apparatus, without implying modification of the production apparatus and at an always maximal productivity level. As there is no interrelation at all between the parameters of each individual layer deposited, no compromise needs to be found between the deposition conditions of each layer. Higher performance devices with steeper interface between neighboring layers can therefore be achieved.

The deposition gas diffusion issues can be avoided thanks to the possible use of a unique deposition chamber for the production of any flexible multi-layer semiconductor device and, for the same reason, the cost of the production apparatus according to the invention is significantly lower than the cost of a roll-to-roll apparatus as described in the prior art.

The roll-to-roll production apparatus according to the invention and the related production method also permit fast production processes fully compatible with mass-production conditions.

DESCRIPTION OF THE DRAWINGS

The invention will be better understood with the description of examples illustrated by the FIGS. 1 to 5 where.

DETAILED DESCRIPTION OF THE INVENTION

The apparatus according to the preferred embodiment of the present invention (FIG. 1) comprises one deposition chamber 1. A reaction region 111 within the deposition chamber is determined by the space between an electrode 11 and a grounded slide shoe 8. The electrode 11 is connected to an radio-frequency (RF) power generator 16 through an RF line 14, allowing the application of an electromagnetic power on the electrode 11 creating an electrical field in the reaction region 111. An impedance adaptor 15 placed between the RF power generator 16 and the RF line 14 prevents undesired reflections on the RF line 14. The power level e and the frequency f of the generated electromagnetic power can be controlled by a computer program product running on a controller 30. Two manifolds 12,13 allow a regular introduction of gas into the reaction region 111 through their apertures 120, 130 and apertures 110 in the electrode 11. Four valves 18, 18', 18", 18''' control the introduction of different gases u, v, w, x. Mass flow controllers 19, 19', 19", 19''' measure and regulate the quantity g, h, i, j of each introduced gas u, v, w, x. The heating elements 9,10 allow temperature regulation within the reaction region 111.

Figure 1:
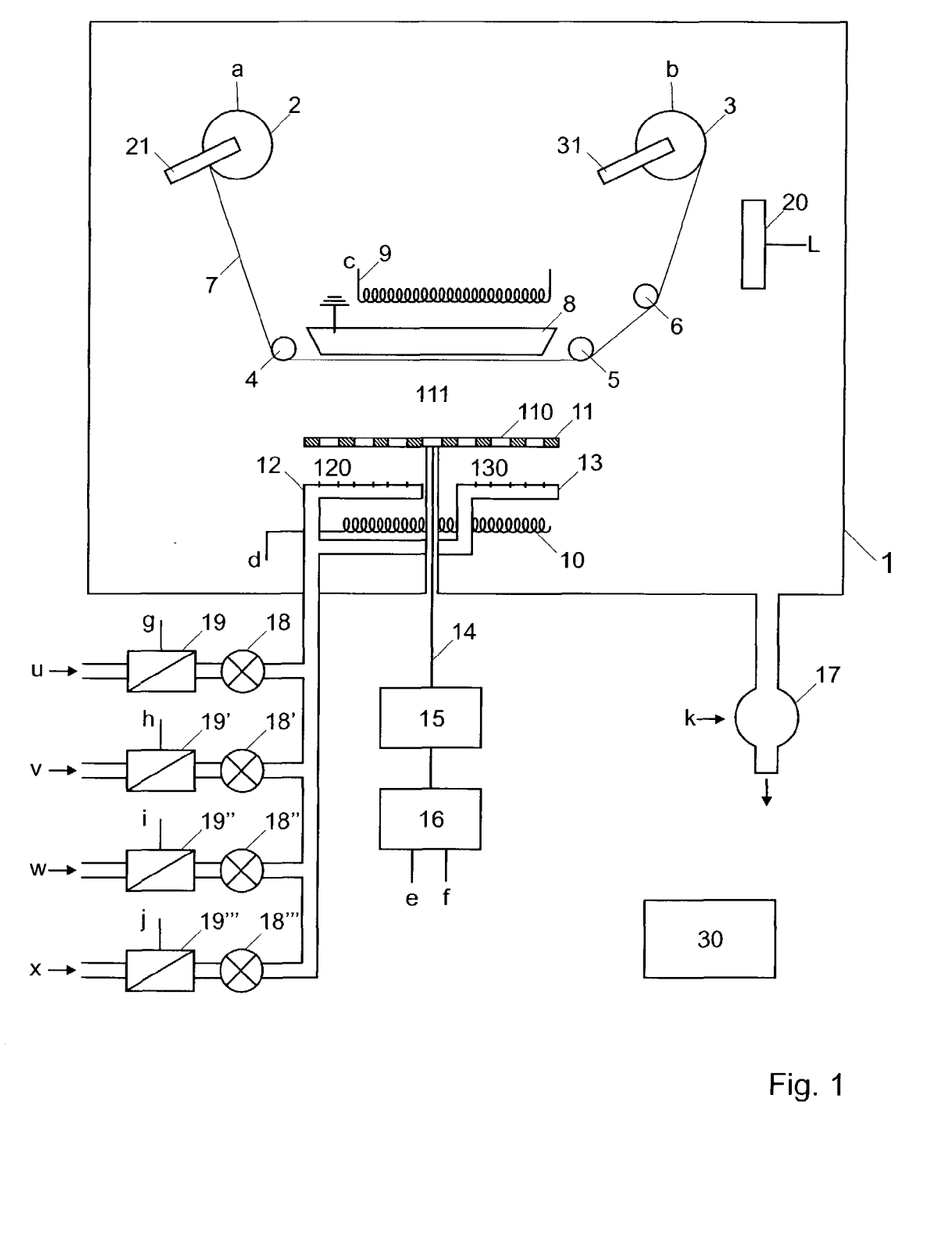
FIG. 1 shows an apparatus according to the preferred embodiment of the present invention.

Two rotatable rolls 2, 3 are placed within the deposition chamber on either side of the reaction region 111. Two motors, for example step motors, rotate the rolls 2, 3 at independently regulated speeds a, b. The motors are arranged so that the sense of rotation of both rolls 2, 3 can be changed. In a variant embodiment, the two rolls 2, 3 are rotated by a single motor, this second embodiment having the disadvantage that the two rolls cannot be driven totally independently from each other. Friction elements 21, 31 provide a sufficient tension on the substrate 7 by applying a braking force on the driven roll, the roll from which the substrate is being pulled. In an equivalent embodiment, the tension is provided by the motor applying a moment on the driven roll in the direction opposite to the roll's movement.

Idler reels 4, 5, 6 prevent the substrate 7 from folding and guide it from one roll through the reaction region 111 where it slides against the grounded slide shoe 8 and onto the other roll. The idler reels 4, 5, 6 also regulate the tension on the substrate 7 and insure a regular movement of the substrate 7 within the reaction region 111 for optimal semiconductor deposition. The idler reels 4, 5, 6 are arranged in order to be effective independently of the traveling direction of the substrate between the rolls 2, 3.

A vacuum pump 17 regulates the pressure k inside the deposition chamber 1 and allows evacuation of remaining reactive gas between two successive deposition phases. In a preferred embodiment, at least one target 20 may be placed along the run of the substrate 7 for additional metal or TCO deposition onto the substrate 7.

The apparatus further comprises a controller 30, preferably a digital computer, for determining and controlling the value of the adjustable parameters, among which the sense of rotation and the rotation speed a, b of the rolls 2, 3, the type of introduced gas u, v, w, x, the mass flow g, h, i, j of the introduced gas, the power level e and frequency f of the electromagnetic power applied to the electrode 11, the pressure k within the chamber 1 and the temperature c, d of the heating elements 9, 10, so as to control the deposition of the semiconductor material onto the substrate 7. The controller 30 performs these operations by running a computer program stored on a computer program product and comprising specific software code portions.

Preferably, the first gas u is a reactive gas containing a P-type doping agent for the deposition of the P-type semiconductor layer, the second gas v is a reactive gas without dopant for the deposition of the intrinsic semiconductor layer, the third gas w is a reactive gas containing a N-type doping agent for the deposition of the N-type semiconductor layer and the fourth gas x is an inert gas used for evacuating reactive gases from the deposition chamber between two successive deposition phases.

The substrate 7 is placed onto the first roll 2. A layer of metal can already have been deposited onto the substrate 7 before semiconductor deposition. The substrate is guided against the first idler reel 4, through the reaction region 111, against the next idler reels 5, 6 and attached to the second roll 3. The deposition chamber 1 is closed. In order to evacuate all undesired gases, particularly water vapor, which could remain in the deposition chamber 1, the deposition chamber 1 is heated and vacuum is generated with the vacuum pump 17. If necessary, the substrate 7 can be rolled during this operation from one roll to the other roll a certain number of times in order to evacuate all humidity.

Once the deposition chamber is ready for deposition, electromagnetic power is applied on the electrode 11, creating an electrical field in the reaction region 111. A first mixture of reactive gases containing the P-doped gas u and the non-doped gas v is introduced into the reaction region 111 by opening the valves 18 and 18' and the mass flow of each gas is controlled by the respective controller 19 or 19'. The concentration of P-type doping agent in the mixture can be adjusted by adjusting the relative mass flow of the reactive gases. The first reactive gas mixture is ionized by the electrical field, creating plasma in the reaction region 111. The semiconductor material starts depositing onto the substrate 7. The second roll 3 is rotated counterclockwise at a speed b regulated by the controller 30, pulling the substrate at a constant speed through the reaction region 111. Since the speed of the substrate 7 through the reaction region 111 determines the time that each part of the substrate spends in the reaction region 111, it is a function of the desired thickness of the P-doped layer. In order to maintain this speed constant, the rotation speed b of the second roll 3 must regularly decrease while its circumference increases. The friction element 21 regulates the tension of the substrate 7 by braking the first roll 2.

Once the P-doped layer has been deposited onto the entire length of the substrate 7 minus a distance at each extremity corresponding to the distance between the reaction region 111 and each roll 2, 3, the electromagnetic power is turned off, the valves 18 and 18' are closed and the vacuum pump 17 creates a vacuum within the deposition chamber 1 evacuating the remaining ions of the first reactive gas u. The fourth valve 18''' is opened and inert gas x is introduced within the deposition chamber 1 to improve the evacuation.

The pressure k inside the deposition chamber 1 is then set to the value needed for the deposition of the intrinsic layer. Electromagnetic power is applied to the electrode and the non-doped reactive gas v is introduced within the reaction region 111 to generate plasma. The substrate is kept stationary until the probability is high enough that P-doped ions deposited onto the inner walls and different organs of the deposition chamber 1 are entirely covered by ions of the non-doped gas. The first roll 2 is then rotated clockwise at a determined speed a, pulling the substrate at a constant speed through the reaction region 111. Since the speed of the substrate 7 through the reaction region 111 determines the time that each part of the substrate spends in the reaction region 111, it is a function of the desired thickness of the intrinsic layer. In order to maintain this speed constant, the rotation speed a of the first roll 2 must regularly decrease while its circumference increases. The friction element 31 regulates the tension of the substrate 7 by braking the second roll 3.

Once the intrinsic layer has been deposited onto the entire length of the substrate 7 minus a distance at each extremity corresponding to the distance between the reaction region 111 and each roll 2,3, the electromagnetic power is turned off, the second valve 18' is closed and the vacuum pump 17 creates a vacuum within the deposition chamber 1 evacuating the remaining ions of the second reactive gas v. The fourth valve 18''' is opened and inert gas x is introduced within the deposition chamber 1 to improve the evacuation.

The pressure k inside the deposition chamber 1 is then set to the value needed for the deposition of the N-doped layer. Electromagnetic power is applied to the electrode and a reactive gas mixture containing the N-doped reactive gas w is introduced within the reaction region 111 to generate plasma. The substrate is kept stationary until the probability is high enough that non-doped ions deposited onto the inner walls and different organs of the deposition chamber 1 are entirely covered by ions of the N-doped gas. The second roll 3 is then rotated counterclockwise at a determined speed b, pulling the substrate at a constant speed through the reaction region 111. Since the speed of the substrate 7 through the reaction region 111 determines the time that each part of the substrate spends in the reaction region 111, it is a function of the desired thickness of the N-doped layer. In order to maintain this speed constant, the rotation speed b of the second roll 3 must regularly decrease while its circumference increases. The friction element 21 regulates the tension of the substrate 7 by braking the first roll 2.

The roll-to-roll production steps described above are an implementation example of the production method according to the invention. The skilled person will easily recognize that the type and the number of deposited semiconductor layers can be modified to obtain any configuration of flexible semiconductor device. In particular, a tandem cell p-i-n-p-i-n or a triple cell p-i-n-p-i-n-p-i-n may be manufactured with the production apparatus according to the invention in which a same substrate is unrolled six or nine times.

When the computer program product is run on a computer, as for example on the controller 30, software code portions automatically determine all parameters for each semiconductor layer according to the desired doping type and thickness before deposition starts, control the parameters during deposition and correct them if the actual thickness of the deposited semiconductor layer differs from the desired one. These parameters include in particular the speed a,b and the sense of rotation of the rolls 2,3 for each successive layer deposition.

Flexible semiconductor devices produced with the method according to the present invention have very low cross-contamination levels between subsequent semiconductor layers. Thanks to the effective evacuation of reactive gases before each deposition phase, the penetration rate from one layer into its neighboring layer is very low. This penetration rate is significantly lower than what can be achieved with multi-chamber apparatus, as ions from one chamber can always travel to a certain extent into the next chamber.

Figure 5:
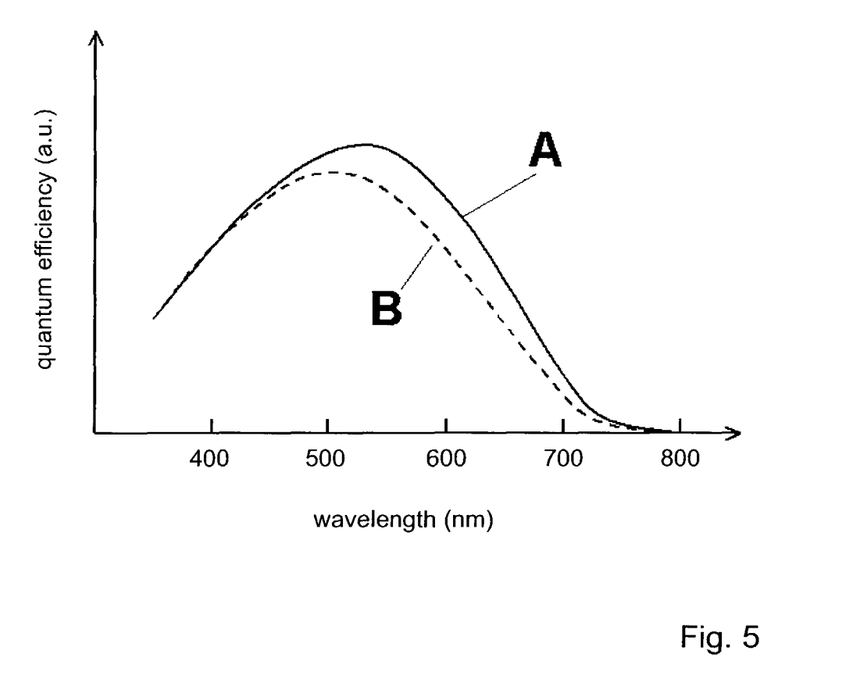
FIG. 5 shows the quantum efficiency curves of two n-i-p solar cells produced with different semiconductor production methods.

An example of the effectiveness of the present invention in significantly reducing this cross-contamination is illustrated in FIG. 5, showing the quantum efficiency curves A and B of two different n-i-p solar cells, produced with different semiconductor production methods. The first solar cell corresponding to the curve A was produced in a production apparatus according to the present invention, on a flexible substrate moving in opposite directions between the fabrication of the n-layer and the fabrication of the intrinsic layer. The second solar cell corresponding to curve B is produced on a stationary substrate in a production apparatus having a unique deposition chamber, and by employing a purge cycle of one minute duration between the deposition of the n-layer and the deposition of the intrinsic layer, hence simulating a production in a multi-chamber apparatus with a purge zone integrated between the deposition chamber for the n-doped layer and the subsequent deposition chamber for the intrinsic layer.

The comparison of the quantum efficiencies of the first solar cell and the second solar cell shows the effect of insufficient removal of phosphorus by the purge cycle during the production process of the second solar cell, resulting in a low quantum efficiency for red light showing on curve B. In contrast, the first solar cell shows a high quantum efficiency for red light (curve A), indicating extremely low level of phosphorus contamination in the intrinsic layer. The one skilled in the art can easily estimate that the concentration of phosphorus in the intrinsic layer of the first solar cell is lower than 1 ppm in at least 90% of the thickness of the intrinsic layer. It is understood that the drop of red light quantum efficiency of the second solar cell B can possibly be reduced by increasing duration and intensity of the purge cycle. Translated to the case of the multi-chamber apparatus, this would mean an unfavorable increase of the purge zone width and/or an increase of purge gas flow.

Laboratory measurements on semiconductor devices produced with the method according to the present invention have shown that the cross-contamination rate of one semiconductor layer into its neighboring semiconductor layer was always inferior to 5% within 10% of the thickness of the neighboring semiconductor layer. In some cases, the cross-contamination rate was inferior to 0.1% within 10% of the thickness of the neighboring semiconductor layer. And with particularly careful evacuation of the gases between two depositions, the cross-contamination rate can be as low as less than 0.0001% within 10% of the thickness of the neighboring semiconductor layer.

In a variant preferred embodiment (FIG. 2), the grounded slide shoe 8 is replaced by a grounded drum 48 which can rotate in both clockwise and counterclockwise directions on rotatable reels 46. When the substrate 7 is either unrolled from the first roll 2 and rolled onto the second roll 3, or unrolled from the second roll 3 and rolled onto the first roll 2, it is led around the circumference of the grounded drum 48 which then rotates at the speed of the substrate 7 in either the counterclockwise or the clockwise direction, supporting the substrate 7 on its way through the deposition chamber 41. Around the grounded drum 48, a concave shaped powered electrode 411 is arranged to create a reaction region 4111 of circular shape. Adapted gas manifolds are used to introduce the reactive gas mixture regularly along the entire reaction region 4111. Circular heaters 409, 410 are placed inside the drum 48 and outside the electrode 411 so as to regulate the temperature inside the reaction region 4111. A first advantage of this embodiment is the very compact design of the deposition chamber 41, preferably in the shape of a ring, for a maximal reaction region area. Another advantage is the important reduction of the frictional forces applied to the substrate 7.

In another variant preferred embodiment (FIG. 3), the unique concave shaped electrode 411 of the previous embodiment is replaced by a plurality of successive concave shaped electrodes 511, which can be powered independently from each other, creating a succession of circular reaction regions 5111. An advantage of this embodiment is the ease to generate and maintain plasma in the successive reaction regions (5111).

In a further variant preferred embodiment (FIG. 4), several grounded slide shoes 8 are arranged in the shape of a regular polygon, supporting the substrate on its way through the deposition chamber 41. A powered linear electrode 11 is placed in front of each slide shoe 8 in order to form a succession of reaction regions arranged in the shape of a polygon. This embodiment also has the advantage to lead to a very compact design of the deposition chamber for a maximal reaction region area. Another advantage is the use of standard linear elements.

Figure 2:
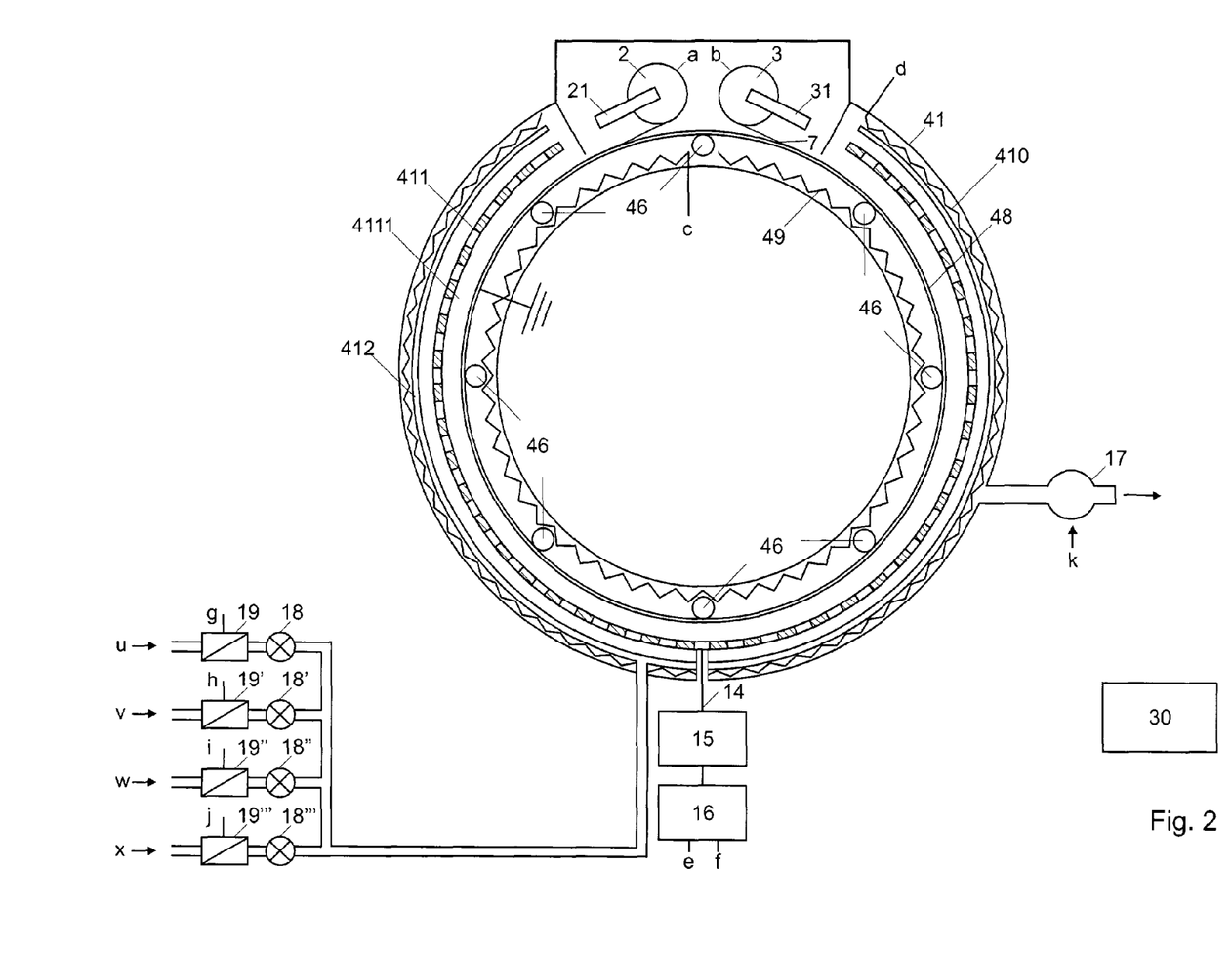
FIG. 2 shows an apparatus according to a variant preferred embodiment of the present invention.
Figure 3:
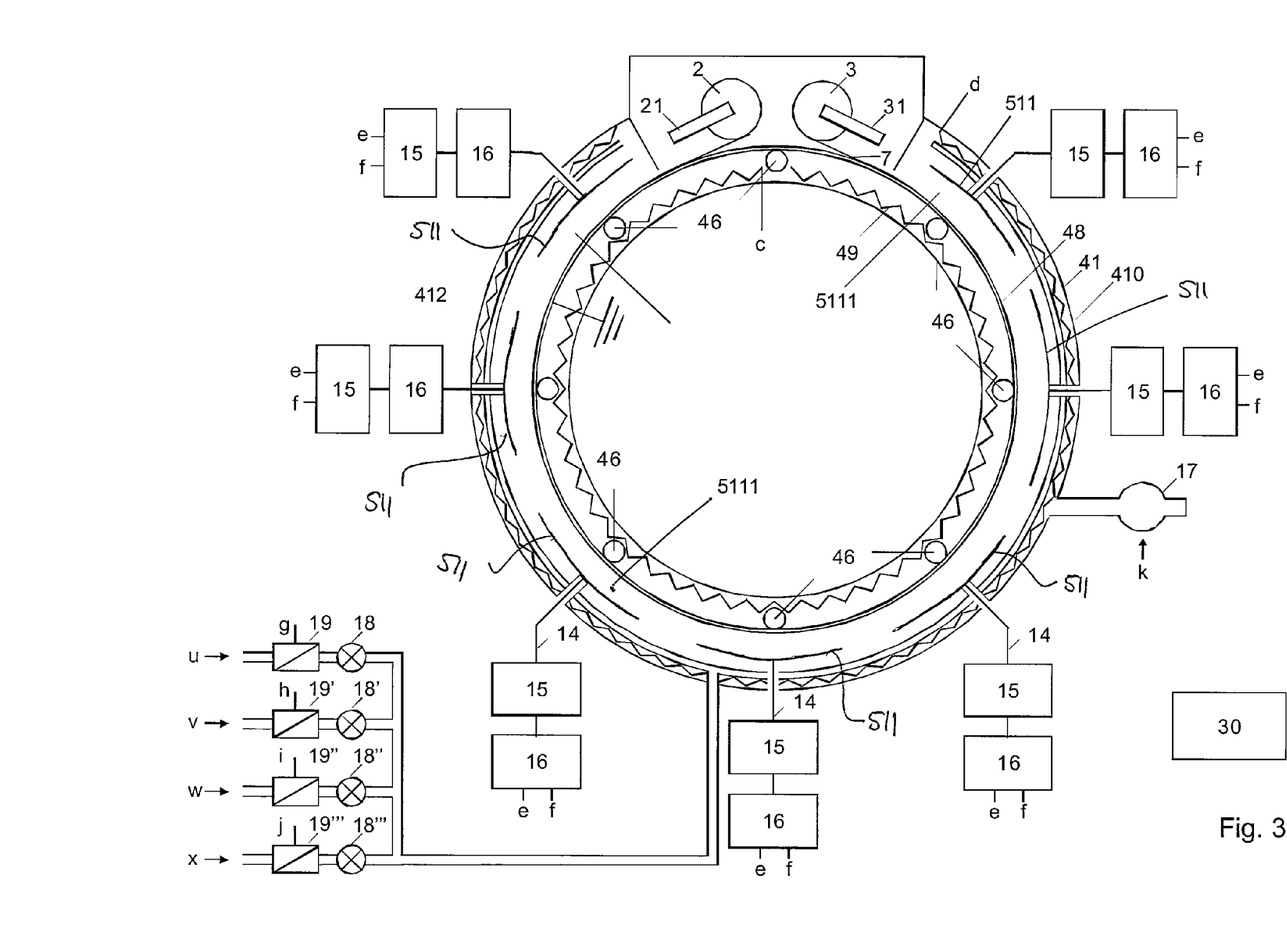
FIG. 3 shows an apparatus according to another variant preferred embodiment of the present invention.

In a non represented variant embodiment of the invention as represented in FIG. 2 or 3, the second roll 3 is eliminated and the substrate is rolled directly onto the grounded drum 48 and unrolled from it to be rolled again onto the first roll 2. In the reaction region 4111, 5111 semiconductor material will only deposit on the outer substrate 7 surface. The other portion of the substrate 7 on the grounded drum 48 are protected from undesired semiconductor depositions.

Although the described preferred embodiments of the apparatus according to the invention comprise only one deposition chamber, the skilled person will understand that the substrate could also be successively driven in opposed directions through a plurality of deposition chambers, thus allowing the deposition of a corresponding number of layers at each passage.

Figure 4:
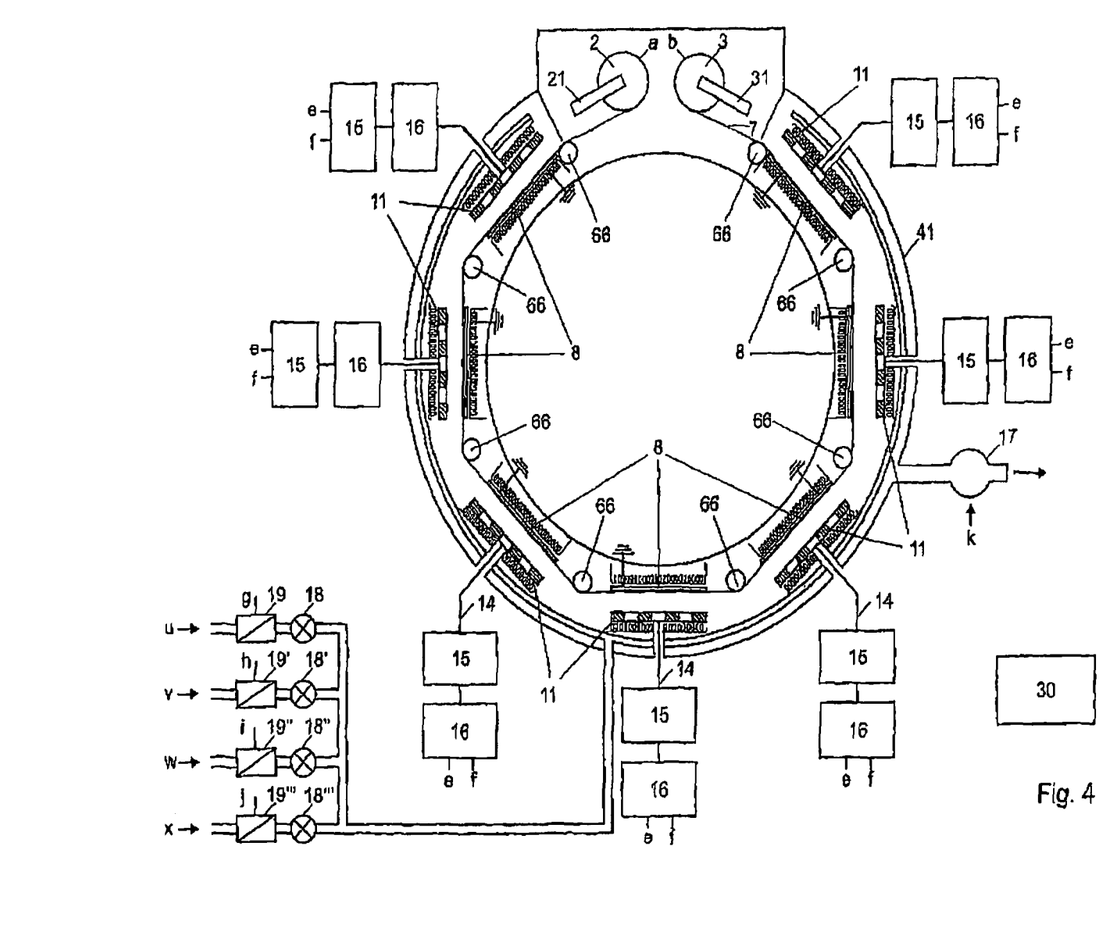
FIG. 4 shows an apparatus according to a further preferred embodiment of the present invention.

In a non-represented variant embodiment of the invention as represented in FIG. 3 or 4, isolation means are inserted in between successive reaction regions, avoiding gas diffusion between them. With adapted gas supplying system, each of these isolated reaction regions or groups of reaction regions can be provided with a differently doped reactive gas and can therefore deposit a different type of semiconductor layer on the substrate 7. This variant embodiment allows the production of a complete semiconductor device with only one passage of the substrate through the deposition chamber.

In a variant embodiment of the roll-to-roll production method according to the invention, the traveling direction of the substrate through the reaction region 111 is always the same, but the respective positions of the first roll 2 and the second roll 3 are exchanged before each successive deposition passage.

The invention claimed is:

1. An apparatus for the continuous production of flexible semi-conductor devices through deposition of a plurality of semiconductor layers onto a moving flexible substrate by using Plasma Chemical Vapor Deposition processing, said apparatus comprising:
at least one deposition chamber, said at least one deposition chamber including at least one reaction region for plasma generation;
a plurality of valves each for introducing a corresponding different one of a plurality gasses into the deposition chamber;
a controller adapted for controlling said plurality of valves for the alternative introduction of said corresponding different gases into the reaction region, wherein each one said gases is for depositing a different semiconductor layer on said substrate;
a RF power generator for the generation of electromagnetic power needed for plasma generation;
a vacuum pump;
two rotatable rolls, arranged so that said flexible substrate can be unrolled from one roll and rolled onto the other roll;
at least one motor for rotating said two rolls, wherein said at least one motor is arranged so that the sense of rotation of said two rolls can be changed; and
friction elements for tensioning the substrate while said substrate is being unrolled from one said roll and rolled onto the other said roll.

2. An apparatus for the continuous production of flexible semi-conductor devices through deposition of a plurality of semiconductor layers onto a moving flexible substrate by using Plasma Chemical Vapor Deposition processing, said apparatus comprising:
a deposition chamber including a reaction region for plasma generation;
a plurality of valves each for introducing a corresponding different one of a plurality of gasses into the deposition chamber;
a controller adapted for controlling said valves for the alternative introduction of said corresponding gases in the reaction region, wherein each one of said gases is for depositing a different semiconductor layer on said substrate;
a RF power generator for the generation of the electromagnetic power needed for plasma generation;
a vacuum pump;
two rotatable rolls, arranged so that said flexible substrate can be unrolled from one roll and rolled onto the other roll;

at least one motor for rotating said two rolls; wherein said at least one motor is arranged so that the sense of rotation of said two rolls can be changed; and friction elements for tensioning the substrate while said substrate is being unrolled from one said roll and rolled onto the other said roll.

3. An apparatus for the continuous production of flexible semi-conductor devices through deposition of a plurality of semiconductor layers onto a moving flexible substrate by using Plasma Chemical Vapor Deposition processing, said apparatus comprising:

a deposition chamber including a reaction region for plasma generation;

a plurality of valves each for introducing a corresponding different one of a plurality of gasses into the deposition chamber;

a controller adapted for controlling said valves for the alternative introduction of said corresponding gases in the reaction region, wherein each one of said gases is for depositing a different semiconductor layer on said substrate;

a RF power generator for the generation of the electromagnetic power needed for plasma generation;

a vacuum pump;

two rotatable rolls, arranged so that said flexible substrate can be unrolled from one roll and rolled onto the other roll; and at least one motor for rotating said two rolls; wherein said at least one motor is arranged so that the sense of rotation of said two rolls can be changed, wherein said controller is further adapted to control the introduction of said gasses such that at least one of said gasses is introduced as the sense of direction of said flexible substrate in said chamber is provided in one direction and wherein at least another of said two or more said gasses is introduced as the sense of direction of said flexible substrate in said chamber is in another direction.

4. An apparatus for the continuous production of flexible semi-conductor devices through deposition of a plurality of semiconductor layers onto a moving flexible substrate by using Plasma Chemical Vapor Deposition processing, said apparatus comprising:

at least one deposition chamber, said at least one deposition chamber including at least one reaction region for plasma generation;

a plurality of valves each for introducing a corresponding different one of a plurality of gasses into the deposition chamber;

a controller adapted for controlling said valves for the alternative introduction of said corresponding gases in the reaction region;

a vacuum pump for forming a vacuum in the chamber;

two rotatable rolls, arranged so that said flexible substrate can be unrolled from one roll and rolled onto the other roll;

at least one motor for rotating said two rolls and being arranged so that the sense of rotation of said two rolls can be changed; wherein said controller is further adapted for changing a sense of direction of said flexible substrate in said chamber such that at least one of said gasses is introduced as the sense of direction of said flexible substrate in said chamber is in one direction and wherein at least another of said gasses is introduced as the sense of direction of said flexible substrate in said chamber is in another direction.

5. The apparatus of claim 4, wherein each one of said gasses is for depositing a different semiconductor layer on said substrate.

6. The apparatus of claim 4, further comprising a plurality of mass flow controllers to control the mass flow of said plurality of gases.

7. The apparatus of claim 4, further comprising friction elements for tensioning the substrate while said substrate is being unrolled from one said roll and rolled onto the other said roll.

8. The apparatus of claim 4, further comprising at least one idler reel for guiding and/or tensioning said flexible substrate, said at least one idler reel being adapted to guide and/or tension said flexible substrate in both directions.

9. The apparatus of claim 4, further comprising an additional valve, wherein said vacuum pump is adapted for providing a vacuum to said deposition chamber for evacuating said deposition chamber between the deposition of at least two of said semiconductor layers and between the change of direction of the substrate, wherein said controller is further adapted for introducing an inert gas using the additional valve during some point of said evacuating.

10. The apparatus of claim 4, further comprising a manifold extending along said substrate, said manifold forming a plurality of apertures along said substrate for introducing said gasses into said deposition chamber.

11. The apparatus of claim 10, further comprising an electrode provided between said manifold and said substrate, said electrode forming a plurality of apertures for allowing said gasses to be introduced to said substrate.

12. The apparatus of claim 10, wherein said manifold is connected to said valves via a single tube for mixing said gases during said introduction.

13. The apparatus of claim 4 further comprising a grounded slide shoe for guiding said substrate.

14. The apparatus of claim 4, further comprising a friction element for providing a braking force on at least one of said rotatable rolls for providing a tension in said substrate.

15. The apparatus of claim 4 further comprising a grounded slide shoe for guiding said substrate.

16. The apparatus of claim 4, further comprising a friction element for providing a braking force on at least one of said rotatable rolls for providing a tension in said substrate.

17. An apparatus for the continuous production of flexible semi-conductor devices through deposition of a plurality of semiconductor layers onto a moving flexible substrate by using Plasma Chemical Vapor Deposition processing, said apparatus comprising:

a deposition chamber including a reaction region for plasma generation;

a first valve for introducing a first gas into the reaction region;

a second valve for introducing a second gas into the reaction region;

two rotatable rolls, arranged so that said flexible substrate can be unrolled from one roll and rolled onto the other roll;

at least one motor for rotating said two rolls and being arranged so that the sense of rotation of said two rolls can be changed for providing said substrate moving in both a first direction and a second direction within said chamber;

a controller adapted for executing a program for controlling said first valve and said at least one motor for introducing said first gas into said region as said substrate is moved in said first direction for depositing a first semiconductor layer on said substrate, and also for controlling said second valve and said at least one motor for introducing said second gas into said region as said substrate is moved in said second direction for depositing a second semiconductor layer on said substrate.

18. The apparatus of claim 17, further comprising an additional valve, wherein said vacuum pump is adapted for providing a vacuum to said deposition chamber for evacuating said deposition chamber between the deposition of at least two of said semiconductor layers and between the change of direction of the substrate, wherein said controller is further adapted for introducing an inert gas using the additional valve during some point of said evacuating.

19. The apparatus of claim 17, further comprising a manifold extending along said substrate, said manifold forming a plurality of apertures along said substrate for introducing said gasses into said deposition chamber.

20. The apparatus of claim 19, further comprising an electrode provided between said manifold and said substrate, said electrode forming a plurality of apertures for allowing said gasses to be introduced to said substrate.

21. The apparatus of claim 19, wherein said manifold is connected to said valves via a single tube for mixing said gases during said introduction.

22. An apparatus for the continuous production of flexible semi-conductor devices through deposition of a plurality of semiconductor layers onto a moving flexible substrate by using Plasma Chemical Vapor Deposition processing, said apparatus comprising:
at least one deposition chamber, said at least one deposition chamber including at least one reaction region for plasma generation;
a plurality of valves each for introducing a corresponding different one of a plurality gasses into the deposition chamber;
a controller adapted for controlling said plurality of valves for the alternative introduction of said corresponding different gases into the reaction region, wherein each one said gases is for depositing a different semiconductor layer on said substrate;
a RF power generator for the generation of electromagnetic power needed for plasma generation;
a vacuum pump;
two rotatable rolls, arranged so that said flexible substrate can be unrolled from one roll and rolled onto the other roll;
at least one motor for rotating said two rolls, wherein said at least one motor is arranged so that the sense of rotation of said two rolls can be changed, wherein
said controller is further adapted to control the introduction of said gasses such that at least one of said gasses is introduced as the sense of direction of said flexible substrate in said chamber is provided in one direction and wherein at least another of said two or more said gasses is introduced as the sense of direction of said flexible substrate in said chamber is in another direction.

23. An apparatus for the continuous production of flexible semi-conductor devices through deposition of a plurality of semiconductor layers onto a moving flexible substrate by using Plasma Chemical Vapor Deposition processing, said apparatus comprising:
at least one deposition chamber, said at least one deposition chamber including at least one reaction region for plasma generation;
a plurality of valves each for introducing a corresponding different one of a plurality of gasses into the deposition chamber;
a controller adapted for controlling said valves for the alternative introduction of said corresponding gases in the reaction region;
a vacuum pump for forming a vacuum in the chamber;
two rotatable rolls, arranged so that said flexible substrate can be unrolled from one roll and rolled onto the other roll;
at least one motor for rotating said two rolls and being arranged so that the sense of rotation of said two rolls can be changed; wherein said controller is further adapted for changing a sense of direction of said flexible substrate in said chamber such that at least one of said gasses is introduced as the sense of direction of said flexible substrate in said chamber is in one direction and wherein at least another of said gasses is introduced as the sense of direction of said flexible substrate in said chamber is in another direction;
a manifold extending along said substrate, said manifold forming a plurality of apertures along said substrate for introducing gasses into said deposition chamber, wherein said manifold is connected to said valves via a single tube for providing a feature of mixing certain gases during said introduction;
an electrode provided between said manifold and said substrate, said electrode forming a plurality of apertures for allowing said gasses to be introduced to said substrate; and
a grounded slide shoe for guiding said substrate.

24. An apparatus for the continuous production of flexible semi-conductor devices through deposition of a plurality of semiconductor layers onto a moving flexible substrate by using Plasma Chemical Vapor Deposition processing, said apparatus comprising:
a deposition chamber including a reaction region for plasma generation;
a first valve for introducing a first gas into the reaction region;
a second valve for introducing a second gas into the reaction region;
two rotatable rolls, arranged so that said flexible substrate can be unrolled from one roll and rolled onto the other roll;
at least one motor for rotating said two rolls and being arranged so that the sense of rotation of said two rolls can be changed for providing said substrate moving in both a first direction and a second direction within said chamber;
a controller adapted for executing a program for controlling said first valve and said at least one motor for introducing said first gas into said region as said substrate is moved in said first direction for depositing a first semiconductor layer on said substrate, and also for controlling said second valve and said at least one motor for introducing said second gas into said region as said substrate is moved in said second direction for depositing a second semiconductor layer on said substrate;
a manifold extending along said substrate, said manifold forming a plurality of apertures along said substrate for introducing gasses into said deposition chamber, said manifold is connected to said valves via a single tube for providing a feature of mixing certain gases during said introduction;
an electrode provided between said manifold and said substrate, said electrode forming a plurality of apertures for allowing said gasses to be introduced to said substrate; and
a grounded slide shoe for guiding said substrate.

\* \* \* \* \*

UNITED STATES PATENT AND TRADEMARK OFFICE
CERTIFICATE OF CORRECTION

PATENT NO. : 8,440,020 B2  
APPLICATION NO. : 10/370935  
DATED : May 14, 2013  
INVENTOR(S) : Diego Fischer et al.

Page 1 of 1

It is certified that error appears in the above-identified patent and that said Letters Patent is hereby corrected as shown below:

In the specification, column 3, line 5, please delete "is" after "production"

Signed and Sealed this  
Twenty-fourth Day of September, 2013

Teresa Stanek Rea  
*Deputy Director of the United States Patent and Trademark Office*